United States Patent [19]

Nelson et al.

[11] Patent Number: 4,631,426
[45] Date of Patent: Dec. 23, 1986

[54] DIGITAL CIRCUIT USING MESFETS

[75] Inventors: Roderick D. Nelson, Minneapolis; Tho T. Vu, Fridley, both of Minn.

[73] Assignee: Honeywell Inc., Minneapolis, Minn.

[21] Appl. No.: 625,151

[22] Filed: Jun. 27, 1984

[51] Int. Cl.$^4$ .................. H03K 19/094; H03K 19/20
[52] U.S. Cl. .................... 307/450; 307/446; 307/473; 307/475
[58] Field of Search .............. 307/443, 446, 448, 450, 307/473, 475, 571, 592, 594, 200 B

[56] References Cited

U.S. PATENT DOCUMENTS

| | | | |
|---|---|---|---|
| 3,775,693 | 11/1973 | Proebsting | 307/450 |
| 4,177,390 | 12/1979 | Cappon . | |
| 4,347,447 | 8/1982 | Proebsting | 307/548 |
| 4,363,978 | 12/1982 | Heimbigner | 307/451 |
| 4,380,709 | 4/1983 | Au | 307/473 |
| 4,384,220 | 5/1983 | Segawa et al. | 307/450 |
| 4,394,589 | 7/1983 | Pham et al. | 307/450 |
| 4,395,645 | 7/1983 | Pernyeszi | 307/450 |
| 4,500,799 | 2/1985 | Sud et al. | 307/450 X |

OTHER PUBLICATIONS

Liechti, "GaAs FET Logic", *Proc. of 6th Int'l Symposium on GaAs and Related Compounds;* Edinburgh, England, 9/1976; pp. 227–236.

Zuleeg et al, "Femtojoule High-Speed Planar GaAs E-JFET Logic"; *IEEE Trans. on Electron Devices;* pp. 628–639; vol. ED-25, No. 6; 6/1976.

Lehovec et al, "Analysis of GaAs FET's for Integrated Logic", *IEEE Trans. on Electron Devices;* vol. ED-27, No. 6, pp. 1074–1091; 6/1980.

Houston et al, "Silicon MESFET Circuit Performance for VLSI"; 1979 *IEEE-ISSCC;* Digest of Technical Papers; pp. 80–81; 2/14/79.

Primary Examiner—Larry N. Anagnos
Attorney, Agent, or Firm—William T. Udseth

[57] ABSTRACT

Two MESFETS with the drain of one connected to the source of the other are driven in complementary fashion by a single inverter using a third MESFET and a voltage level shifter, in response to digital signals input to the inverter. Means for selectively disconnecting the power supply from the inverter to place the circuit in a low power, standby mode is provided. Depletion and enhancement mode MESFET configurations of the circuit are disclosed.

13 Claims, 5 Drawing Figures

DIGITAL CIRCUIT USING MESFETS

BACKGROUND OF THE INVENTION

1. Field of the Invention

This invention relates to digital circuits wherein the source of one metal-semiconductor field-effect transistor (MESFET) is directly electrically connected to the drain of a second MESFET, and the MESFETS are driven in complementary fashion by logic signals controlled by an inverter which includes a third MESFET. The invention further relates to the above described circuit including a means for disabling the logic input to place the circuit in a standby, low power state. The preferred embodiment uses predominately depletion mode MESFETS.

2. Prior Art

Various schemes are known for driving two FETS in complementary fashion. In U.S. Pat. No. 4,347,447 to Proebsting, two metal-oxide semiconductor FETS (MOSFETS) are driven in complementary fashion by an inverter (see transistor 16, FIG. 1 therein). In U.S. Pat. No. 4,363,978 to Heimbigner two enhancement mode MOSFETS serve to separately invert logic signals and separately drive two enhancement mode MOSFETS in complementary fashion. In U.S. Pat. No. 4,380,709, issued to Au, enhancement mode MOSFETS are driven in complementary fashion by separate inverters, each of the inverters employing a depletion mode MOSFET.

Additionally, the circuits disclosed in the patents to Proebsting, Heimbigner and Au each include means for placing the circuits in a third or standby state. In Proebsting, a disable signal is provided by using two depletion mode MOSFETS. When the circuit of Proebsting is disabled, the output pin is left floating and a high impedance will be present at the logic output pin. In Heimbigner a "float" mode exists in which the output circuit will neither supply current to the output load or switch the output load to ground, and therefore other drivers can control the logic state of the output load. Heimbigner provides float and not-float signal through separate enhancement mode MOSFETS.

In Au, a disable circuit employs four MOSFETS (including depletion and enhancement types) and leaves the output floating when activated.

For many low power, high speed digital operations, MESFETS offer advantages over MOSFET circuits. This is particularly true when the substrate is GaAs instead of silicon due to the high mobility of electrons in GaAs.

Heretofore, a simple MESFET circuit for driving two MESFETS in complementary fashion has not been disclosed. Likewise, an output buffer providing a low power standby state in addition to the simple MESFET circuit indicated above has also not been previously disclosed. The low power tristate function is an important system feature no previously disclosed for GaAs buffer circuits.

SUMMARY OF THE INVENTION

The invention is an integrated circuit having a substrate. The source of a first MESFET is directly electrically connected to the drain of a second MESFET. The combination is connected between a voltage supply and ground. A third MESFET has its drain directly electrically connected to an electrical load (which in turn is connected to a second voltage supply) and its source connected to ground. The third MESFET serves as an inverter with the logic input being applied to its gate and the logic output being taken from its drain. The drain of the third MESFET is connected to the gate of the first MESFET. The logic signal input to the gate of the third MESFET is also directly input to the gat of the second MESFET. The logic output of the entire circuit is taken at the connection between the source of the first MESFET and the drain of the second MESFET. The logic input signal applied to the gates of the second and third MESFETS will drive the first and second MESFETS in complementary fashion.

A further embodiment of the invention includes means for selectively disconnecting the electrical load from the second voltage supply. This provides a third or standby state of the circuit where the output floats and the circuit is at high impedance.

Preferably, depletion mode MESFETS are employed as the first, second and third MESFETS and GaAs is the substrate material. If depletion mode MESFETS are used, the output from the third MESFET/inverter, will be level shifted to accommodate the negative threshold voltages of the depletion mode MESFETS.

DESCRIPTION OF THE PREFERRED EMBODIMENT

MESFET as used herein refers to the commonly recognized structure of a metallic gate (or gates) overlying a solid substrate between ohmic source and drain contacts. The substrate is selected to provide a flow of majority carriers between the source and drain contacts upon the application of a sufficient potential difference between the contacts. The flow of majority carriers is controlled by the potential difference between the gate and the substrate. Doped regions of a first conductivity type are provided beneath each of the source and drain contacts. The channel region beneath the metallic gate is a doped region of either a first or second conductivity type. If the channel region is doped with the first conductivity type, providing a negative bias voltage on the gate relative to the source produces a depletion mode device, and providing a positive biasing voltage on the gate relative to the source produces an enhancement mode device. If the channel region is doped with the second conductivity type and the second conductivity type is P-type, a positive gate to source potential difference produces an enhancement device, whereas if the second conductivity type is N-type a negative gate to source potential difference produces an enhancement device.

Figure 1:
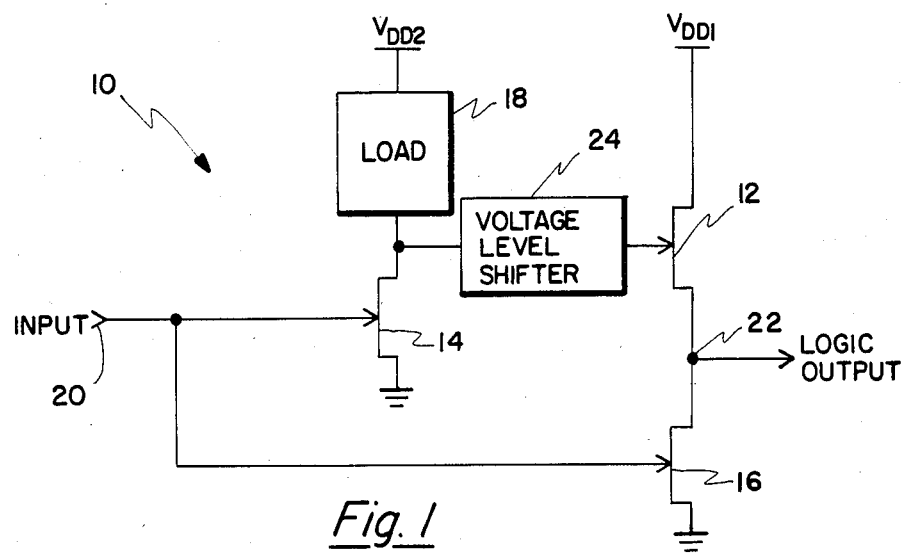
FIG. 1 is the basic MESFET driver circuit of the present invention using depletion mode MESFETS.

Circuit 10 of FIG. 1 includes first 12, second 14 and third 16 MESFETS, an electrical load 18, an input 20, a logic output 22, and a voltage reference point (e.g., ground). The drain of MESFET 12 is directly electrically connected to a first voltage supply ($V_{DD1}$), and the source of MESFET 12 is directly electrically connected to the drain of MESFET 16 and logic output node 22. The source of MESFET 16 is directly electrically connected to ground.

The drain of MESFET 14 is directly electrically connected to electrical load 18, which in turn is directly electrically connected to a second voltage supply ($V_{DD2}$). The source of MESFET 14 is directly electrically connected to ground. The drain of MESFET 14 is also electrically connected to the gate of MESFET 12, either directly or through a voltage level shifter 24 connected between the drain of MESFET 14 and the gate of MESFET 12. Input 20 is directly electrically connected to the gates of MESFETS 14 and 16.

The first and second voltage supplies may be the same supply depending on one's desires and design considerations, but the supplies are shown separately to depict the most general case. If MESFETS 12, 14 and 16 are depletion mode MESFETS, voltage level shifter 24 is generally employed to reduce "low" logic voltage values at the drain of MESFET 14 to below the threshold voltage of MESFET 12. This insures that MESFET 12 will be off when the drain voltage of MESFET 14 is low.

In operation, circuit 10 receives either a high or low logic voltage signal at input 20. If the logic voltage signal applied to input 20 is high, MESFETS 14 and 16 will be turned on. The drain of MESFET 14 will be pulled near to ground, i.e., a low logic value. The low voltage at the drain of MESFET 14 will (after being shifted by voltage level shifter 24) turn MESFET 12 off. With MESFET 12 off and MESFET 16 on, logic output node 22 is pulled towards ground thereby producing a low logic output value at node 22 and for circuit 10.

If the logic voltage signal applied to input 20 is low, MESFETS 14 and 16 will be turned off. The voltage at the drain of MESFET 14 will be pulled towards $V_{DD2}$, i.e., a high logic value. The high value at the drain of MESFET 14 will in turn (and after being shifted by voltage level shifter 24) turn MESFET 12 on. With MESFET 12 on and MESFET 14 off, logic output node 22 is pulled towards $V_{DD1}$ thereby producing a high logic output value at node 22 and for circuit 10.

From the above description of the operation of circuit 10, it is seen that MESFET 14 and load 18 serve as a inverter which is employed to drive MESFETS 12 and 16 in complementary fashion.

Figure 2:
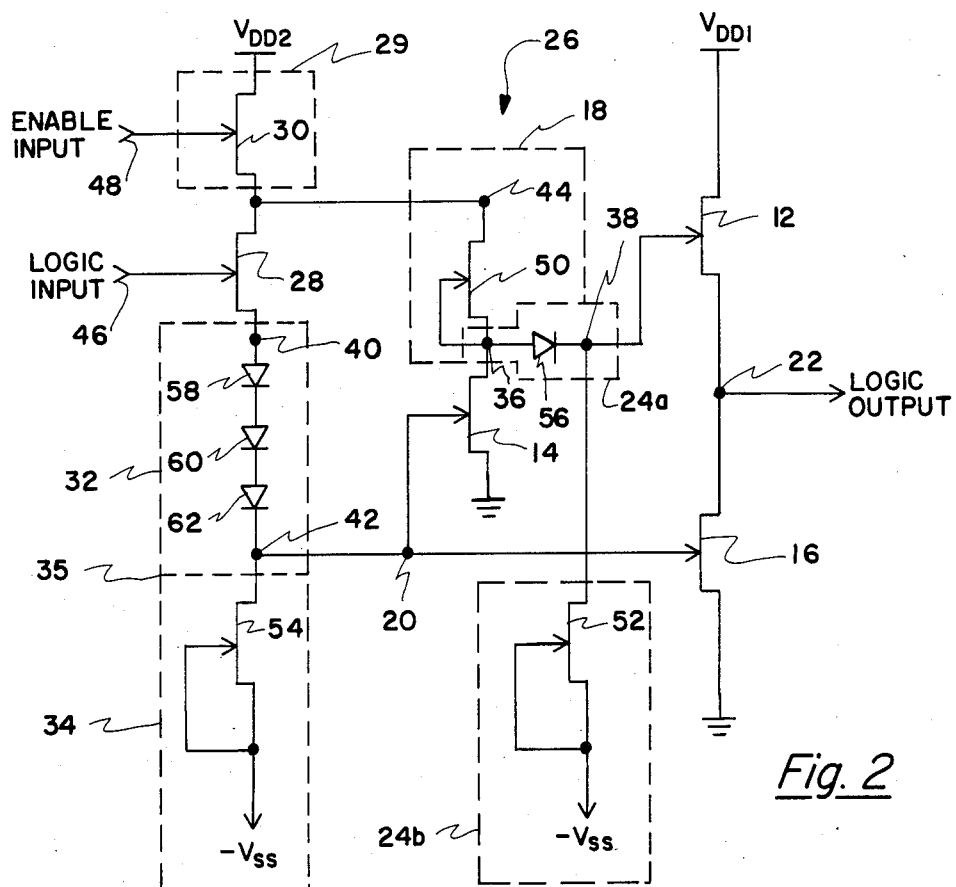
FIG. 2 is a tri-state output buffer circuit for digital integrated circuits using depletion mode MESFETS and incorporating the circuit of FIG. 1.

Circuit 10 is expanded in circuit 26 of FIG. 2. Corresponding components in circuits 10 and 26 are like numbered for clarity. In addition to the components of circuit 10, circuit 26 employs voltage level shifting means 24 as the first of two voltage level shifting means and separates voltage level shifting means 24 into a first resistance means 24a and a first current source 24b. Circuit 26 further includes MESFET 28, disabling means 29 (disabling means 29 is preferably MESFET 30), a second resistance means 32 and a second current source 34. Resistance means 32 and current source 34 comprise a second voltage level shifting means 35. First voltage level shifting means 24 has an input 36 and output 38, and second voltage level shifting means 35 has an input 40 and output 42. Load 18 has a first terminating region (i.e., the same node as input 36) and a second terminating region 44.

Circuit 26 also includes a logic input 46 which is directly electrically connected to the gate of MESFET 28 and an enable input 48 which is directly electrically connected to the gate of MESFET 30.

The drain of MESFET 30 is directly electrically connected to $V_{DD2}$, and the source of MESFET 30 is directly electrically connected to the drain of MESFET 28. The source of MESFET 28 is directly electrically connected to input 40 of the second voltage level shifting means 35. The output 42 of the second voltage level shifting means is directly electrically connected to current source 34 and to input node 20. The first terminating region 36 of the first voltage level shifting means 24 is directly electrically connected to the drain of MESFET 14. The second terminating region 38 of the first voltage level shifting means 24 is directly electrically connected to current source 24b and to the gate of MESFET 12.

As stated above, disable means 29 is preferably MESFET 30. For convenience MESFET 30 is a depletion mode MESFET, load 18 is a depletion mode MESFET 50 with source and gate shorted. Further for convenience, current sources 24b and 34 are MESFETS 52 and 54, respectively, with their sources and gates shorted and the source of each of MESFETS 52 and 54 is directly electrically connected to a third voltage supply $V_{SS}$ which is negative relative to ground. It is further convenient to provide a Schottky diode 56 a first resistance means 24a and three series connected Schottky diodes 58, 60 and 62 as second resistance means 32.

In operation, corresponding portions of circuits 10 and 26 function in the same manner. It should be noted that the current source 24b is selected so that diode 56 is always forward biased. Similarly, current source 34 keeps the series of diodes 58, 60 and 62 always forward biased.

If the logic enable signal applied to input 48 is low, disable means 29 disconnects circuit 26 from voltage supply $V_{DD2}$ (i.e., MESFET 30 is off). When MESFET 30 is off, circuit 26 is placed in a third standby mode. In the standby mode, logic output node 22 floats and circuit impedance is very high. Logic signals applied to input 46 will not affect node 22 when the enable signal is low. The standby mode is a particularly valuable feature which allows circuit 26 to consume as little as one tenth of the power consumed as when circuit 26 is enabled.

If the logic enable signal is high, disable means 29 connects $V_{DD2}$ to the drain of MESFET 28 and to load 18. In the enabled mode, logic signals applied to input 46 are either high or low. If the logic signal applied at input 46 is high, MESFET 28 is turned on pulling the source of MESFET 28 high which in turn (as described above for circuit 10) results in MESFET 16 being turned on and MESFET 12 being turned off. Logic output node 22 goes low in this case.

If the logic signal applied at input 46 is low when circuit 26 is in the enabled mode, MESFET 28 is turned off dropping the drain of MESFET 28 low. This in turn (after the low voltage at the drain of MESFET 28 is further appropriately reduced by second voltage level shifting means 35) results in MESFET 16 being turned off and MESFET 12 being turned on pulling logic output node 22 high.

Conveniently, diodes 56, 58, 60 and 62 are all the same. This means that the voltage levels of the outputs from the source of MESFET 28 and the drain of MESFET 14 are shifted by different amounts. This difference is needed in circuit 26 because the threshold voltages of MESFETS 12 and 16 are different due to the extra voltage drop to ground which MESFET 12 experiences (as compared to MESFET 16) as a result of leakage through MESFET 16 when MESFET 16 is off.

Simulations of the performance of circuit 26 with $V_{DD1}$ at 5 volts, $V_{DD2}$ at 2.5 volts and $V_{SS}$ at $-1.5$ volts have yielded 0.9 mw average power consumption in the standby mode and 10 mw average power consumption in the enable mode.

Figure 3:
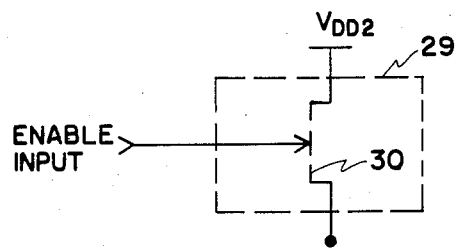
FIG. 3 is an alternative means for disabling the circuit of FIG. 2 using an enhancement mode MESFET.
Figure 4:
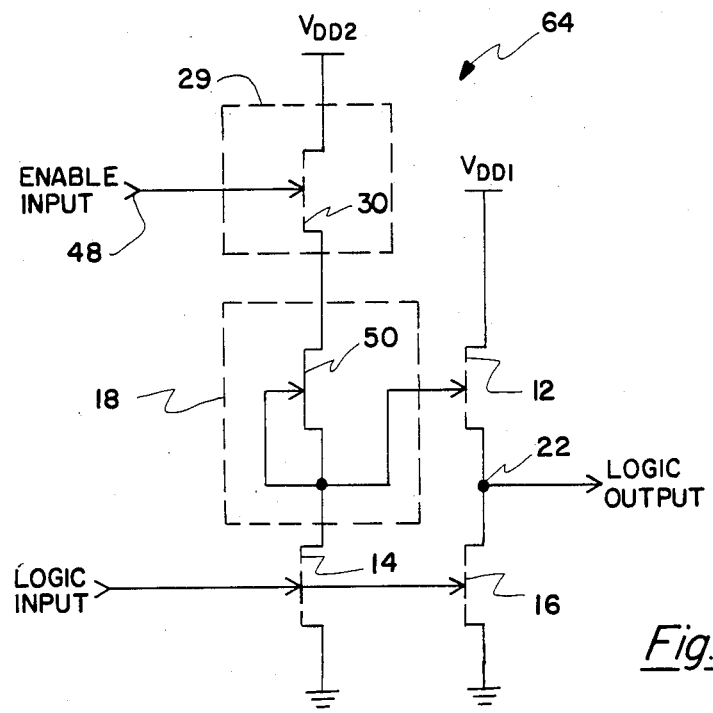
FIG. 4 is an enhancement mode MESFET version of the circuit of FIG. 2.

FIG. 3 depicts an alternative disabling means 29 wherein an enhancement mode MESFET is employed instead of a depletion mode MESFET as MESFET 30. The alternative of FIG. 3 could be used in circuit 26 or in the enhancement mode version of circuit 26 (i.e., circuit 64) shown in FIG. 4. Note that corresponding components of circuits 26 and 64 are numbered the same. Circuit 64 employs only one depletion mode MESFET (i.e., 50), and does not require MESFETS 28 and 54 or diodes 58, 60 and 62, which served to shift the logic input voltage level in circuit 26.

Figure 5:
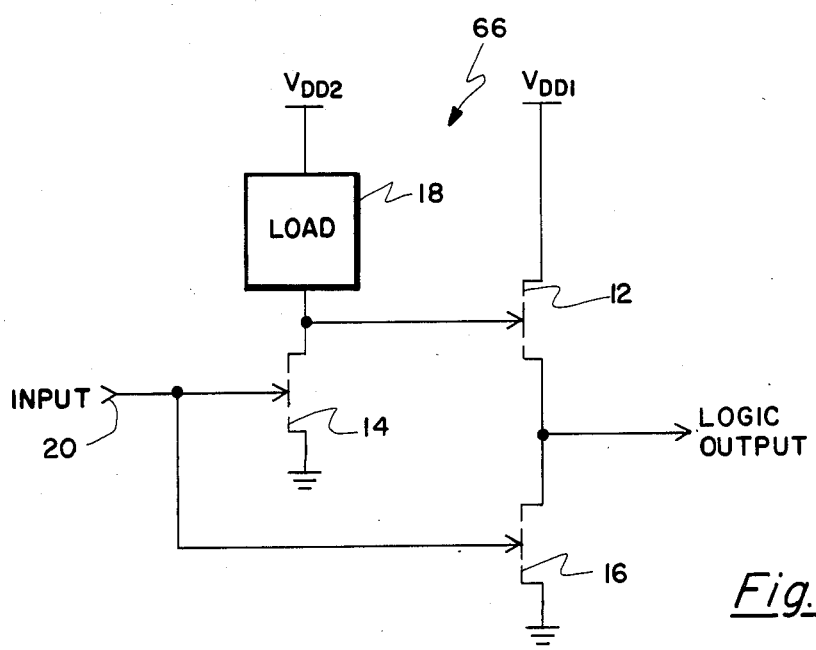
FIG. 5 is an enhancement mode MESFET version of the circuit of FIG. 1.

An enhancement mode MESFET version of circuit 10 is shown as circuit 66 in FIG. 5. Again corresponding components of circuits 10 and 66 are like numbered. Note that in circuit 64 and 66 the voltage level shifting means are deleted because the output voltages need not be compensated for negative threshold voltages when enhancements mode MESFETS are being switched.

What is claimed is:

1. An electrical circuit having an input for receiving a digital electrical signal of either a first or second value, a logic output node and a voltage reference point, and being adapted to connect to first and second voltage supplies, comprising:

means for inverting said digital electrical signal applied to said input to produce an inverted digital electrical signal, said inverting means including a first metal-semiconductor field effect transistor (MESFET) having a first source, a first drain and a first gate, wherein said first gate is directly electrically connected to said input, said first drain is electrically connected to said first voltage supply, said first source is directly electrically connected to said voltage reference point and said inverted digital electrical signal is generated at said first drain;

a second MESFET having a second source, second drain and a second gate, wherein said second MESFET is a depletion mode MESFET and said second drain is directly electrically connected to said second voltage supply;

a third MESFET having a third source, third drain and a third gate wherein said digital electrical signal applied to said input is also applied to said third gate, said third source is directly electrically connected to said voltage reference point and said third drain is directly electrically connected to said second source at said logic output node;

and wherein application of said digital electrical signal of said first value to said input will turn off said first and third MESFETs, and application of said digital electrical signal of said second value to said inupt will turn on said first and third MESFETs; and means for shifting the voltage level of said inverted digital signal to a lower voltage inverted digital signal, said lower voltage inverted digital signal being applied to said second gate and being sufficient to turn on said second MESFET when said digital electrical signal of said first value is applied to said input, and said lower voltage inverted digital signal being sufficient to turn off said second MESFET when said digital electrical signal of said second value is applied to said input.

2. The circuit of claim 1 wherein said first MESFETS is a depletion mode MESFETS.

3. The circuit of claim 1 wherein said first MESFET is an enhancement mode MESFET.

4. The circuit of claim 1 wherein said first and second voltage supplies are the same voltage supply.

5. An electrical circuit having an input for receiving a digital electrical signal of either a first or second value, a logic output node and a voltage reference point, and being adapted to connect to first and second voltage supplies, comprising:

means for inverting said digital electrical signal applied to said input to produce an inverted digital electrical signal, said inverting means comprising an electrical load having first and second terminating regions and a first depletion mode metal-semiconductor field effect transistor (MESFET) having a first source, a first drain and a first gate, wherein said first gate is directly electrically connected to said input, said first drain is directly electrically connected to said first terminating region, said second terminating region is electrically connected to said first voltage supply, said first source is directly electrically connected to said voltage reference point and said inverted digital electrical signal is generated at said first drain;

a second depletion mode MESFET having a second source, second drain and a second gate, wherein said second drain is directly electrically connected to said second voltage supply;

a third depletion mode MESFET having a third source, third drain and a third gate, wherein said digital electrical signal applied to said input is also applied to said third gate, said third source is directly electrically connected to said voltage reference point and said third drain is directly electrically connected to said second source at said logic output node;

and wherein application of said digital electrical signal of said first value to said input will turn off said first and third MESFETs, and application of said digital electrical signal of said second value to said input will turn on said first and third MESFETs; and means for shifting the voltage level of said inverted digital signal to a lower voltage inverted digital signal, said lower voltage inverted digital signal being applied to said second gate and being sufficient to turn on said second MESFET when said digital electrical signal of said first value is applied to said input, and said lower voltage inverted digital signal being sufficient to turn off said second MESFET when said digital electrical signal of said second value is applied to said input.

6. The circuit of claim 5 wherein said first and second voltage supplies are the same voltage supply.

7. An electrical circuit having a logic input, an enable input, a voltage reference point, a logic output node and being adapted to connect to first and second voltage supplies, comprising:

first voltage level shifting means having a first input node and a first output node;

second voltage level shifting means having a second input node and a second output node;

electrical load means having first and second terminating regions, wherein first terminating region is directly electrically connected to said second input node;

first and second current sources, wherein said first current source is directly electrically connected to said first output node and said second current source is directly electrically connected to said second output node;

first metal-semiconductor field effect transistor (MESFET) having a first source, first drain and a first gate, wherein said first drain is directly electrically connected to said first voltage supply, said first gate is directly electrically connected to said enable input and said first source is directly electrically connected to said second terminating region;

second MESFET having a second source, second drain and a second gate, wherein said second MESFET is a depletion mode MESFET, said second drain is directly electrically connected to said second terminating region and said first source, said second gate is directly electrically connected to said logic input and said second source is directly electrically connected to said first input node;

third MESFET having third source, third drain and third gate, wherein said third MESFET is a depletion mode MESFET, said third drain is directly electrically connected to said first terminating region, said third gate is directly electrically connected to said first current source and said first output node, and said third source is directly electrically connected to said reference voltage point;

fourth MESFET having fourth source, fourth drain and fourth gate, wherein said fourth MESFET is a depletion mode MESFET, said fourth drain is directly electrically connected to said second voltage supply, said fourth gate is directly electrically connected to said second output node and said second current source, and said fourth source is directly electrically connected to said logic output node; and fifth MESFET having fifth source, fifth drain and fifth gate, wherein said fifth MESFET is a depletion mode MESFET and said fifth drain is directly electrically connected to said logic output node, said fifth gate is directly electrically connected to said first output node and said third gate, and said fifth source is directly electrically connected to said voltage reference point.

8. The circuit of claim 7 wherein said first and second voltage supplies are the same voltage supply.

9. The circuit of claim 7 wherein said first voltage level shifting means comprises first, second and third Schottky diodes, each diode having an anode and a cathode, said first, second and third diodes being connected in series with the anode of said first diode being said first input node and the cathode of said third diode being said first output, node.

10. The circuit of claim 9 wherein said second voltage level shifting means comprises a fourth diode with an anode and a cathode, wherein the anode of said fourth diode is said second input node and the cathode of said fourth diode is said second output node.

11. The circuit of claim 7 being further adapted to connect to a third voltage supply and wherein said first current source includes a sixth MESFET having a sixth source, a sixth drain and a sixth gate, wherein said sixth MESFET is a depletion mode MESFET, said sixth source is directly electrically connected to said third voltage supply and said sixth gate, and said sixth drain is directly electrically connected to said first output node, said third gate and said fifth gate.

12. The circuit of claim 11 wherein said second current source includes a seventh MESFET having seventh source, seventh drain, and seventh gate, wherein said seventh MESFET is a depletion mode MESFET, said seventh source is directly electrically connected to said third voltage supply and to said seventh gate, and said seventh drain is directly electrically connected to said second output node.

13. The circuit of claim 12 wherein said electrical load is an eighth MESFET having eighth source, eighth drain and eighth gate, wherein said eighth MESFET is a depletion mode MESFET, said eighth drain is said second terminating region, said eighth source is said first terminating region and is directly electrically connected to said eighth gate.

* * * * *